United States Patent
Yajima

(10) Patent No.: US 7,964,472 B2
(45) Date of Patent: Jun. 21, 2011

(54) METHOD OF PRODUCING SEMICONDUCTOR DEVICE

(75) Inventor: Ayako Yajima, Matsumoto (JP)

(73) Assignee: Fuji Electric Systems Co., Ltd. (JP)

( * ) Notice: Subject to any disclaimer, the term of this patent is extended or adjusted under 35 U.S.C. 154(b) by 22 days.

(21) Appl. No.: 12/476,887

(22) Filed: Jun. 2, 2009

(65) Prior Publication Data

US 2009/0294917 A1    Dec. 3, 2009

(30) Foreign Application Priority Data

Jun. 2, 2008 (JP) ................................. 2008-144915

(51) Int. Cl.
*H01L 21/027* (2006.01)
*H01L 23/544* (2006.01)

(52) U.S. Cl. ................ 438/401; 257/797; 257/E23.179; 257/E21.585; 257/622

(58) Field of Classification Search .................. 438/401; 257/797, 622, E21.548, E21.585, E23.179
See application file for complete search history.

(56) References Cited

U.S. PATENT DOCUMENTS

| | | | | |
|---|---|---|---|---|
| 5,503,962 A * | 4/1996 | Caldwell | ........................ | 430/317 |
| 5,893,744 A * | 4/1999 | Wang | ............................ | 438/401 |
| 5,899,335 A * | 5/1999 | Boyer et al. | ................... | 206/538 |
| 5,950,093 A * | 9/1999 | Wei | ................................ | 438/401 |
| 5,963,816 A * | 10/1999 | Wang et al. | .................... | 438/401 |
| 6,037,671 A * | 3/2000 | Kepler et al. | .................. | 257/797 |
| 6,043,133 A * | 3/2000 | Jang et al. | ..................... | 438/401 |
| 6,049,137 A * | 4/2000 | Jang et al. | ..................... | 257/797 |
| 6,100,158 A * | 8/2000 | Lee et al. | ....................... | 438/401 |
| 6,218,262 B1 * | 4/2001 | Kuroi et al. | .................... | 438/401 |
| 6,218,266 B1 * | 4/2001 | Sato et al. | ...................... | 438/427 |
| 6,232,200 B1 * | 5/2001 | Chu | ................................ | 438/401 |
| 6,239,031 B1 * | 5/2001 | Kepler et al. | .................. | 438/692 |
| 6,303,458 B1 * | 10/2001 | Zhang et al. | ................... | 438/401 |
| 6,303,460 B1 * | 10/2001 | Iwamatsu | ....................... | 438/401 |
| 6,326,309 B2 * | 12/2001 | Hatanaka et al. | ............... | 438/693 |
| 6,368,972 B1 * | 4/2002 | Maury et al. | ................... | 438/692 |
| 6,383,910 B2 * | 5/2002 | Okada et al. | ................... | 438/622 |
| 6,440,816 B1 * | 8/2002 | Farrow et al. | .................. | 438/401 |
| 6,767,800 B1 * | 7/2004 | Tsai et al. | ...................... | 438/401 |
| 6,825,078 B1 * | 11/2004 | Huang | ............................. | 438/242 |
| 7,192,839 B1 * | 3/2007 | Ramkumar et al. | ........... | 438/401 |

(Continued)

FOREIGN PATENT DOCUMENTS

JP           2004-63894 A      2/2004

(Continued)

*Primary Examiner* — Mary Wilczewski
(74) *Attorney, Agent, or Firm* — Rossi, Kimms & McDowell LLP

(57) ABSTRACT

A semiconductor device is manufactured by forming a mask having a first opening and a second opening wider than the first opening on a principal surface of a first conductivity type semiconductor substrate, etching semiconductor portions of the first conductivity type semiconductor substrate exposed in the first and second openings to thereby form a first trench in the first opening and form a second trench deeper than the first trench in the second opening, and filling the first and second trenches with a second conductivity type semiconductor to concurrently form an alignment marker for device production and a junction structure of alternate arrangement of the first conductivity type semiconductor and the second conductivity type semiconductor. In this manner, it is possible to provide a semiconductor device in which a parallel pn structure and an alignment marker can be formed concurrently to improve the efficiency of a manufacturing process.

6 Claims, 5 Drawing Sheets

U.S. PATENT DOCUMENTS

| | | | |
|---|---|---|---|
| 7,642,178 B2 * | 1/2010 | Yamauchi et al. | 438/505 |
| 7,750,429 B2 * | 7/2010 | Dyer et al. | 257/506 |
| 7,863,151 B2 * | 1/2011 | Takei | 438/429 |
| 2001/0036738 A1 * | 11/2001 | Hatanaka et al. | 438/693 |
| 2005/0221547 A1 * | 10/2005 | Yamauchi et al. | 438/172 |
| 2007/0072397 A1 * | 3/2007 | Yamauchi et al. | 438/478 |
| 2008/0121880 A1 * | 5/2008 | Park | 257/48 |
| 2008/0283962 A1 * | 11/2008 | Dyer et al. | 257/513 |
| 2009/0061590 A1 * | 3/2009 | Hwang | 438/401 |
| 2009/0273102 A1 * | 11/2009 | Nogami et al. | 257/797 |
| 2009/0294917 A1 * | 12/2009 | Yajima | 257/622 |
| 2009/0317959 A1 * | 12/2009 | Takei | 438/429 |

FOREIGN PATENT DOCUMENTS

JP     2006-303232 A     11/2006

* cited by examiner

METHOD OF PRODUCING SEMICONDUCTOR DEVICE

BACKGROUND

The present invention relates to a method of producing a semiconductor device. In particular, the invention relates to a method of producing a semiconductor device including forming trenches in a semiconductor substrate and filling the trenches by an epitaxial growth method.

Heretofore, in a semiconductor device such as an MOSFET (Metal Oxide Semiconductor Field Effect Transistor), an IGBT (Insulated Gate Bipolar Transistor), a bipolar transistor, a diode, etc., when a region in which a drift current flows (hereinafter referred to a drift layer) is made thin, the current path of the drift current is shortened so that on-resistance becomes low but the withstand voltage becomes low. In contrast, when the drift layer is made thick, the withstand voltage becomes high but on-resistance becomes high. In this manner, this type of semiconductor device has a trade-off relationship between the on-resistance (current capacity) and the withstand voltage.

A super junction structure is commonly known as a technique for improving the trade-off relationship. FIG. 10 is a sectional view showing the super junction structure of the semiconductor device. As shown in FIG. 10, the super junction structure is a structure in which the drift layer is formed not as a single semiconductor layer, but instead, as a junction structure (hereinafter referred to as 'parallel pn structure 4') of alternate arrangement of a high impurity concentration n-type semiconductor region 2 and a high impurity concentration p-type semiconductor region 3. A method of forming a trench in an n-type drift layer by dry etching and filling the trench with a p-type semiconductor by epitaxial growth has been proposed as a method for forming the parallel pn structure 4.

A field oxide film, a gate oxide film and a gate electrode, which are not shown in FIG. 10, are formed successively in a surface layer of the parallel pn structure 4 by an ordinary MOSFET producing process, so that p base regions 5 are formed as shown in FIG. 10. On this occasion, it is necessary to form a p base region 5 in a surface layer of each p-type semiconductor region 3 accurately in order to obtain a required operation of the semiconductor device. It is therefore necessary to form a marker (hereinafter referred to as 'alignment marker') in the surface layer of the n-type drift layer before the formation of the parallel pn structure 4 so that the marker can serve as a reference for accurately aligning a semiconductor substrate with a photo mask disposed above the semiconductor substrate. When a mask pattern needs to be transferred, the alignment marker is recognized by an exposure apparatus or the like so that the photo mask can be disposed in an accurate position. Consequently, the desired mask pattern is transferred onto a surface of the parallel pn structure 4.

The following method has been proposed as a method for forming the aforementioned alignment marker. In a semiconductor device producing method including the step of flattening a surface of a semiconductor substrate by buffing in the middle of a wafer process, an alignment marker formed before the flattening step is shaped like an inverted taper in sectional view. On this occasion, the semiconductor substrate has alternate and parallel arrangement of a p layer and an n layer shaped like stripes perpendicular to a principal surface of the semiconductor substrate. Then, isotropic etching of silicon is used for forming an alignment hole-like marker shaped like an inverted taper in sectional view (see, for example, JP-A-2006-303232).

The following method has been proposed as another method for forming the aforementioned alignment marker. A first trench is formed in an n-type semiconductor substrate so that the first trench can serve as a target trench. The inside of the first trench and the surface of the semiconductor substrate are covered with a mask. The mask is partially removed from a region in which a second trench will be formed. The second trench is formed in the unmasked region of the semiconductor substrate. On this occasion, while a p-type semiconductor is epitaxially grown on the inside of the second trench in the condition that the depth of the first trench is set to be larger than one fifth of the depth of the second trench, p-type semiconductor regions are formed in a parallel pn junction structure. After removal of the mask, the surface of the semiconductor substrate is polished by a thickness corresponding to a value not larger than one fifth of the depth of the second trench. On this occasion, the mask is made of an oxide film (see, for example, JP-A-2004-063894).

However, an additional step only for the formation of the alignment marker as disclosed in JP-A-2006-303232 is required for forming the alignment marker in addition to the ordinary MOSFET producing process. In the technique disclosed in JP-A-2004-063894, the mask oxide film remains on the surface of the n-type drift layer when the trenches are filled with p-type semiconductors by epitaxial growth. When the epitaxial layers are grown in a state where the mask oxide film remains, there is a possibility that defects may be produced in the epitaxial layers of the p-type semiconductor region and the n-type semiconductor region by stress of the mask oxide film. There is a possibility that the defects may be a cause of occurrence of a leakage current.

In view of the above, it would be desirable to provide an efficient semiconductor device producing method for forming a device surface structure in a desired position of a surface layer of a semiconductor substrate in production of a semiconductor device having a super junction structure. It would further be desirable to provide a semiconductor device producing method which can reduce defects produced in an epitaxial layer when a super junction structure region is formed in a semiconductor device.

SUMMARY OF THE INVENTION

The invention provides an efficient semiconductor device producing method for forming a device surface structure in a desired position of a surface layer of a semiconductor substrate in production of a semiconductor device having a super junction structure. The invention further provides a semiconductor device producing method which can reduce defects produced in an epitaxial layer when a super junction structure region is formed in a semiconductor device.

In accordance with a first embodiment of the invention, a semiconductor device producing method includes forming a mask having a first opening and a second opening wider than the first opening on a principal surface of a first conductivity type semiconductor substrate (a mask step), etching semiconductor portions of the first conductivity type semiconductor substrate exposed in the first and second openings to thereby form a first trench in the first opening and form a second trench deeper than the first trench in the second opening (an etching step), filling the first and second trenches with second conductivity type semiconductors respectively so that the width of the second trench is in a range of from 1.6 times to 2.5 times (both inclusively) as large as the width of the first trench (a filling step), removing all the mask remaining in the mask step after the etching step before the filling step, wherein the filling step performs formation of an alignment marker for device production concurrently with formation of a junction structure of alternate arrangement of the first conductivity type semiconductor and the second conductivity type semiconductor by growing the second conductivity type semiconductor so that an upper end portion of the second trench remains as it is not filled with the second conductivity type semiconductor while the first trench is filled with the second conductivity type semiconductor.

According to a second aspect of the invention, a pattern of the first trench on a plane surface of the substrate is shaped like stripes while a pattern of the second trench on the plane surface of the substrate is shaped like a rectangle.

According to the invention, an alignment marker can be formed easily concurrently with the formation of the junction structure of alternate arrangement of the first conductivity type semiconductor and the second conductivity type semiconductor. For this reason, it is unnecessary to provide any additional step only for the formation of the alignment marker in the ordinary MOSEFT producing process. Accordingly, improvement in efficiency of the producing process can be attained. Moreover, because the lower limit of the width of the second trench is 1.6 times as large as the width of the first trench, the upper end portion of the second trench not filled with the second conductivity type semiconductor remains as an alignment marker even when the first trench is filled with the second conductivity type semiconductor in the condition that the mask is removed fully. Accordingly, the alignment marker can be recognized accurately. For this reason, the mask can be removed fully before the first trench is filled with the second conductivity type semiconductor. Accordingly, defects produced in the epitaxial layer by the influence of stress of the mask can be reduced. Moreover, because the upper limit of the width of the second trench is 2.5 times as large as the width of the first trench, black silicon can be prevented from being produced in the second trench during etching. In addition, foreign matter such as pieces of the removed resist film or particles can be removed easily even when the foreign matter is deposited on the inside of the second trench in a post step. Accordingly, a trench etching process without etching defects can be achieved, so that device characteristic can be prevented from deteriorating. Moreover, the surface structure of the device can be aligned accurately.

In the semiconductor device producing method according to the invention, producing efficiency can be improved in production of a semiconductor device having a super junction structure. Moreover, defects produced in the epitaxial layer formed on the semiconductor substrate can be reduced.

It will be understood that other features, advantages, modifications, etc. of the invention will become apparent to those skilled in the art from the following detailed description of the preferred embodiments of the invention and the accompanying drawings.

BRIEF DESCRIPTION OF THE DRAWINGS

The invention will now be described in greater detail with referenced to the following detailed description of the preferred embodiments of the invention and the accompanying drawings, wherein.

DETAILED DESCRIPTION OF THE PREFERRED EMBODIMENTS OF THE INVENTION

In this specification and the accompanying drawings, the prefix 'n' or 'p' attached to a layer or region means that electrons or holes are majority carriers. The superscript '+' attached to the prefix 'n' means that the impurity concentration of the layer or region is higher than that of a layer or region having no superscript '+' Incidentally, in the following description of embodiment and the accompanying drawings, like numerals refer to like constituent parts for the sake of avoidance of duplicate description.

Figure 1:
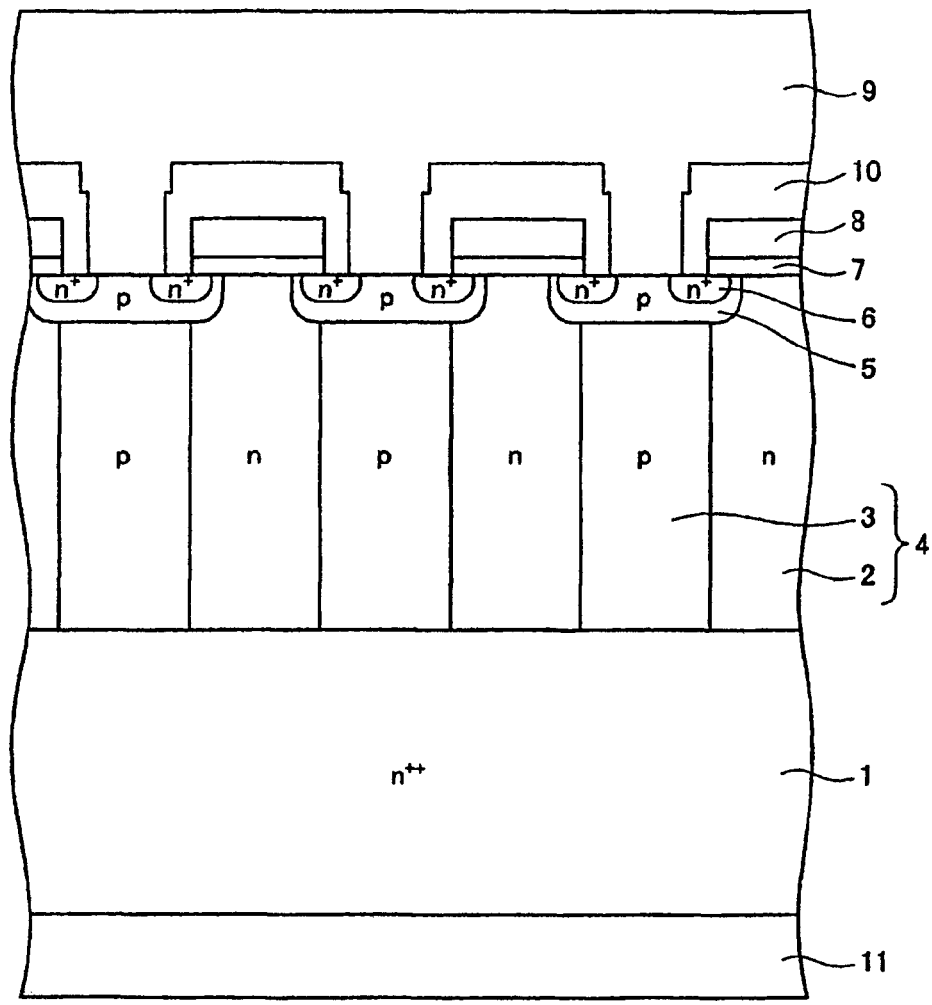
FIG. 1 is a sectional view showing an example of a super junction semiconductor device produced by a producing method according to the invention.

FIG. 1 is a sectional view showing an example of a super junction semiconductor device produced by a producing method according to the invention. Description will be made in the case where a vertical MOSFET is used as an example. As shown in FIG. 1, a parallel pn structure 4 in which n-type semiconductor regions 2 and p-type semiconductor regions 3 are joined alternately is provided on a low resistance $n^{++}$ drain layer 1. A high impurity concentration p base region 5 is provided in a surface layer of each of the p-type semiconductor regions 3 in the parallel pn structure 4. A high impurity concentration n+source region 6 is provided in a surface layer of each p base region 5.

A gate electrode 8 is provided, through a gate oxide film 7, on a surface of each p base region 5 between the corresponding n-type semiconductor region 2 of the parallel pn structure 4 and the corresponding $n^+$ source region 6. A source electrode 9 is in contact with the p base regions 5 and the $n^+$ source regions 6. The source region 9 is electrically insulated from the gate electrodes 8 by interlayer insulating films 10. A drain electrode 11 is provided on a rear surface of the $n^{++}$ drain layer 1. A surface of the semiconductor device is covered with a surface protection film not shown.

Figure 2:
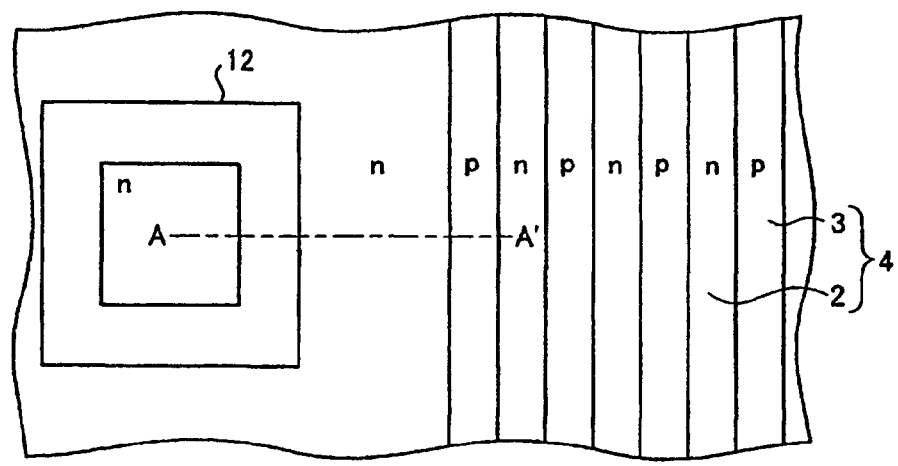
FIG. 2 is a plan view showing a super junction structure and an alignment marker in the semiconductor device produced by the producing method according to the invention.

FIG. 2 is a plan view showing an example of arrangement of the parallel pn structure and an alignment marker in the semiconductor device according to the embodiment. For example, as shown in FIG. 2, the alignment marker 12 is formed in the surface layer of the n-type semiconductor so as to be far from the parallel pn structure 4. For example, the alignment marker 12 is shaped like a rectangular frame as shown in FIG. 2 and formed as a cavity in the surface layer of the n-type semiconductor. The alignment marker 12 is formed in a region such as a scribe part region which has no influence on the surface structure of the device and which will be cut off when a wafer is separated into chips.

Figure 3:
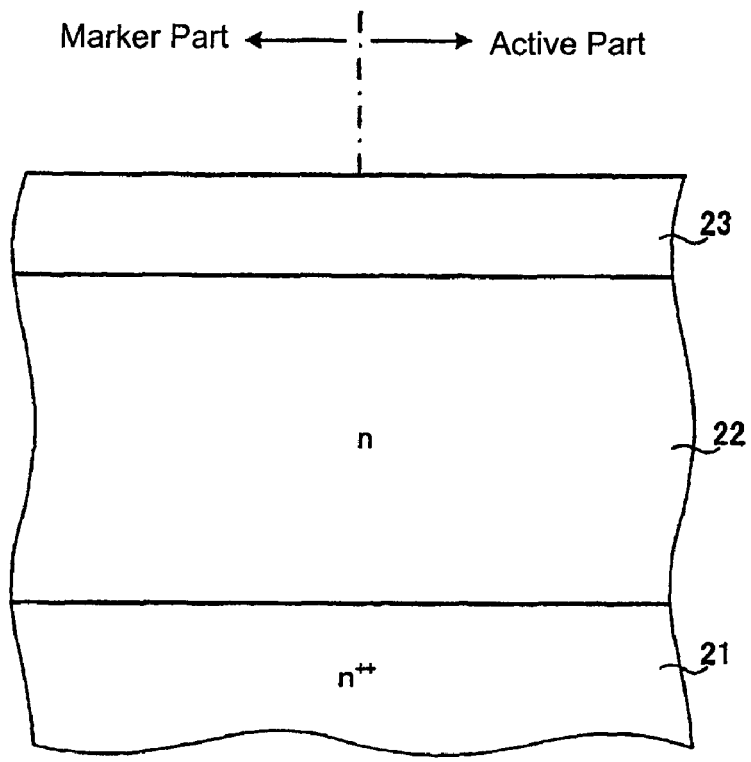
FIG. 3 is a sectional view showing the semiconductor device producing method according to the invention.

FIGS. 3 to 9 are sectional views showing a semiconductor device producing method according to the invention. Each of FIGS. 3 to 9 is a sectional view showing a sectional structure taken along a cutting line A-A' containing a part of the parallel pn structure 4 and a part of the alignment marker 12 as shown in FIG. 2. In each of FIGS. 3 to 9, the left half shows an alignment marker part (hereinafter referred to as marker part) and the right half shows an active part. First, as shown in FIG. 3, an n-type low resistance silicon substrate ($n^{++}$ substrate) 21 is prepared and an n-type semiconductor 22 is epitaxially grown on a surface of the n-type low resistance substrate 21. The n-type low resistance substrate 21 serves as an n++drain layer 1.

Figure 4:
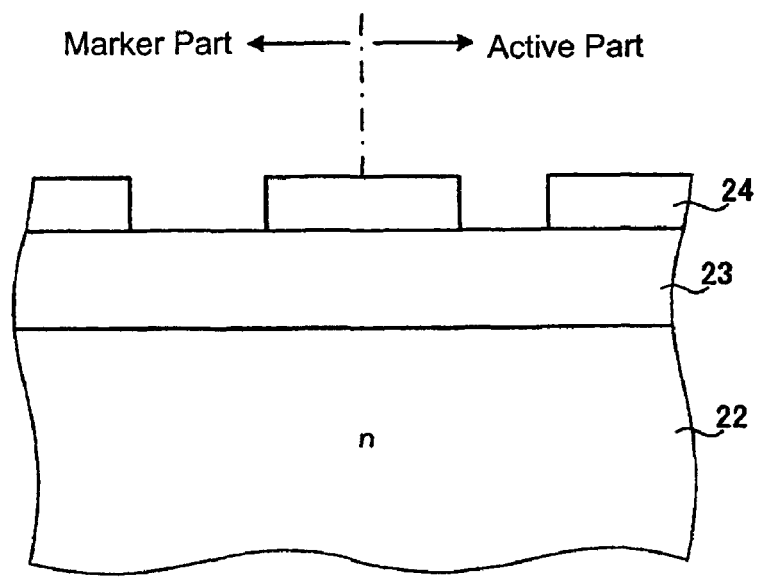
FIG. 4 is a sectional view showing the semiconductor device producing method according to the invention.
Figure 5:
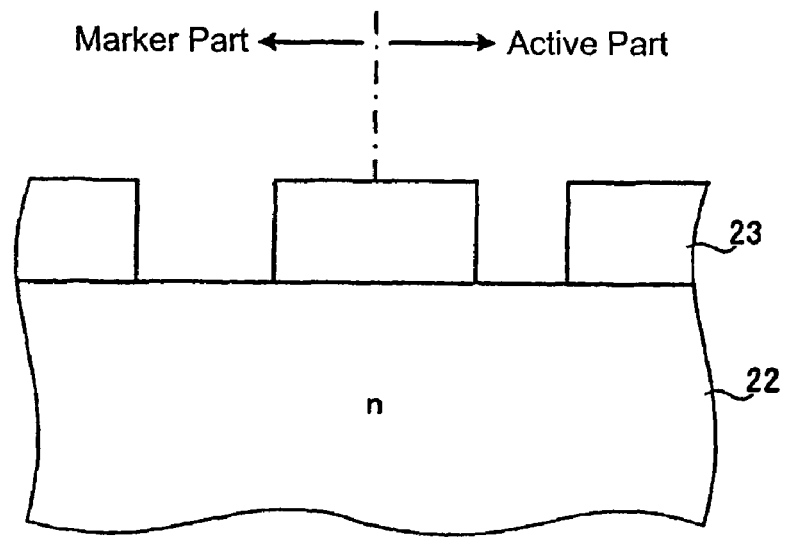
FIG. 5 is a sectional view showing the semiconductor device producing method according to the invention.

Then, as shown in FIG. 4, a mask oxide film 23 is formed on a surface of the n-type semiconductor 22, for example, by a thermal oxidation method and a resist film 24 is applied on a surface of the mask oxide film 23. Photolithography is applied to the resist film 24 to remove the resist film 24 selectively from part of the active part region and part of the marker part region. On this occasion, the width of removal of the resist film 24 from part of the marker part region is set to be larger than the width of removal of the resist film 24 from part of the active part region. Then, as shown in FIG. 5, etching is performed with the remaining part of the resist film 24 as a mask to form openings in the mask oxide film 23 on part of the active part region and part of the marker part region. On this occasion, the width of the opening formed in the mask oxide film 23 on part of the marker part region is larger than the width of the opening formed in the mask oxide film 23 on part of the active part region.

Figure 6:
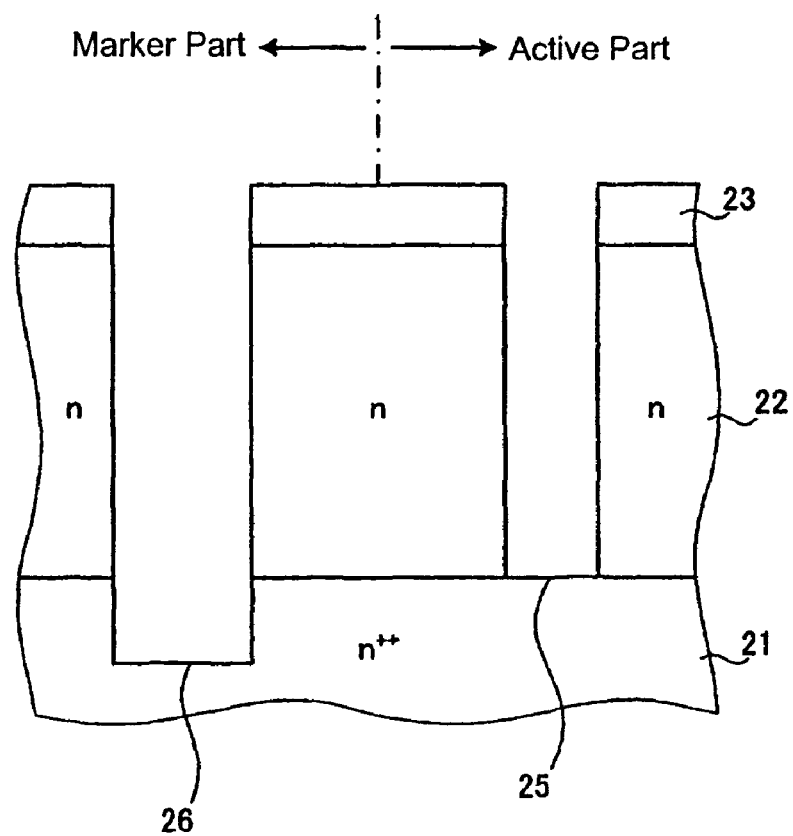
FIG. 6 is a sectional view showing the semiconductor device producing method according to the invention.

As shown in FIG. 6, for example, the semiconductor device in a state shown in FIG. 5 is put into a chamber (not shown), portions of the n-type semiconductor 22 exposed in the openings of the mask oxide film 23 are etched while a protection film-forming gas and an etching gas are supplied alternately into the chamber at time intervals of a few seconds, so that trenches are formed in the active part region and the marker part region. On this occasion, a first trench 25 reaching the n-type low resistance substrate 21 is formed in the active part region. At the same time, in the marker part region, the n-type low resistance substrate 21 is etched so that a second trench 26 deeper than the first trench 25 is formed. On this occasion, the mask oxide film 23 is slightly etched concurrently with the formation of the trenches. The remaining portions of the n-type semiconductor 22 after the formation of the trenches serve as n-type semiconductor regions 2 in the parallel pn structure 4.

Figure 7:
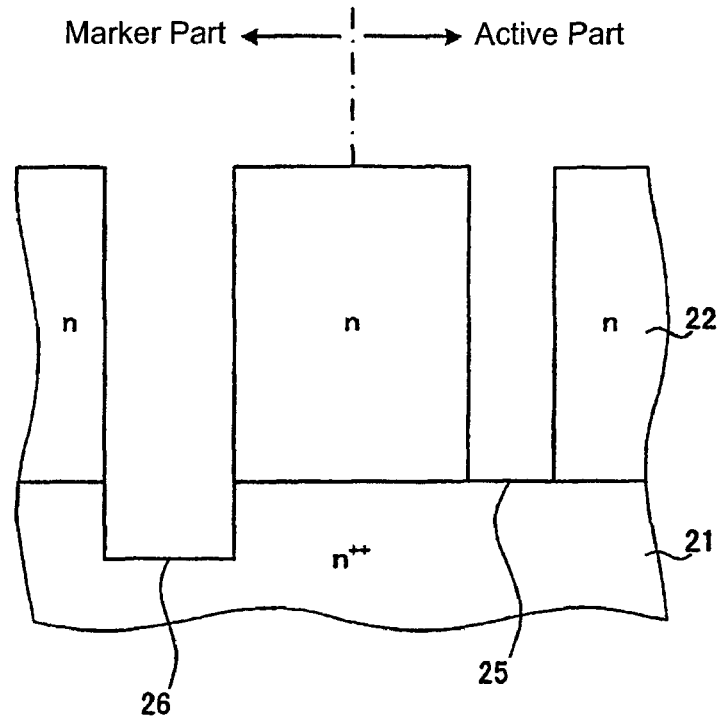
FIG. 7 is a sectional view showing the semiconductor device producing method according to the invention.
Figure 8:
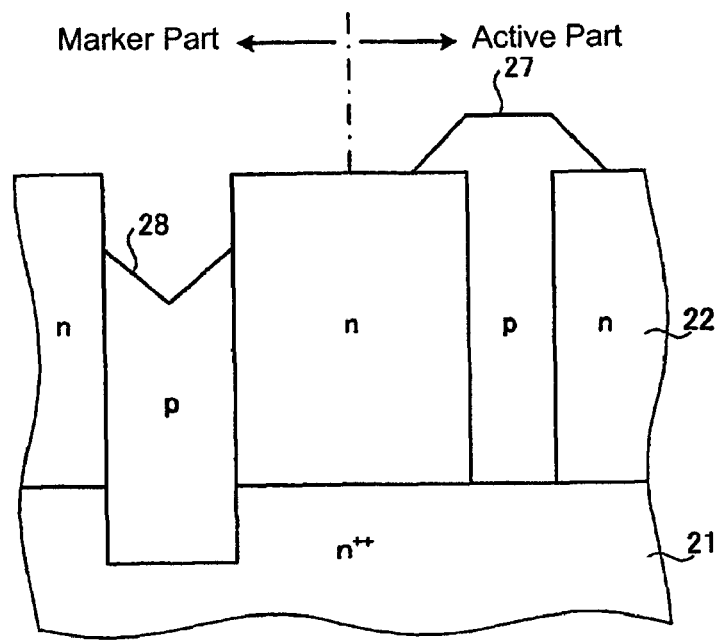
FIG. 8 is a sectional view showing the semiconductor device producing method according to the invention.

The semiconductor device in a state shown in FIG. 6 is removed from the chamber, all the remaining portions of the mask oxide film 23 are removed as shown in FIG. 7. Then, after inner portions of the trenches are cleaned, the first trench 25 in the active part region is filled with a p-type semiconductor 27 by an epitaxial growth method as shown in FIG. 8. The p-type semiconductor 27 serves as a p-type semiconductor region 3 in the parallel pn structure 4. At the same time, the second trench 26 in the marker part region is filled with a p-type semiconductor 28. On this occasion, an upper end portion of the second trench 26 remains as it is not filled with the p-type semiconductor 28.

Figure 9:
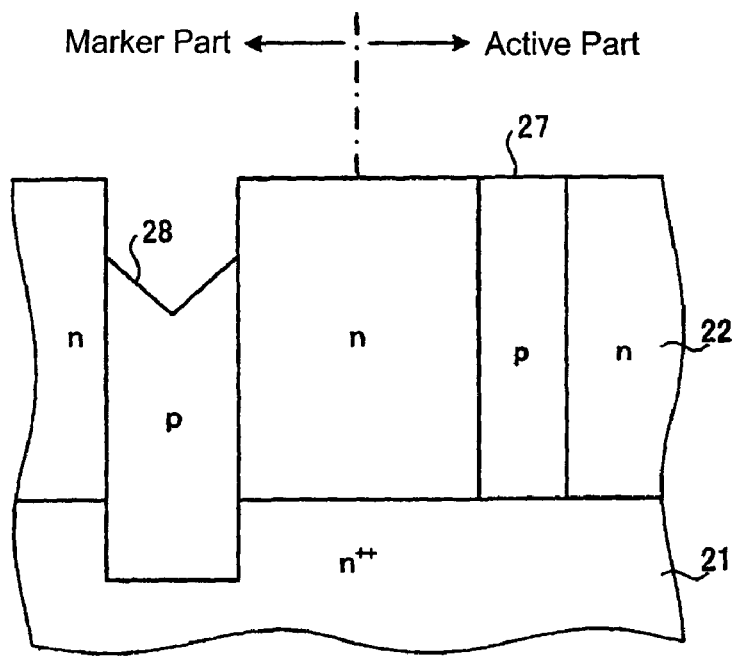
FIG. 9 is a sectional view showing the semiconductor device producing method according to the invention.
Figure 10:
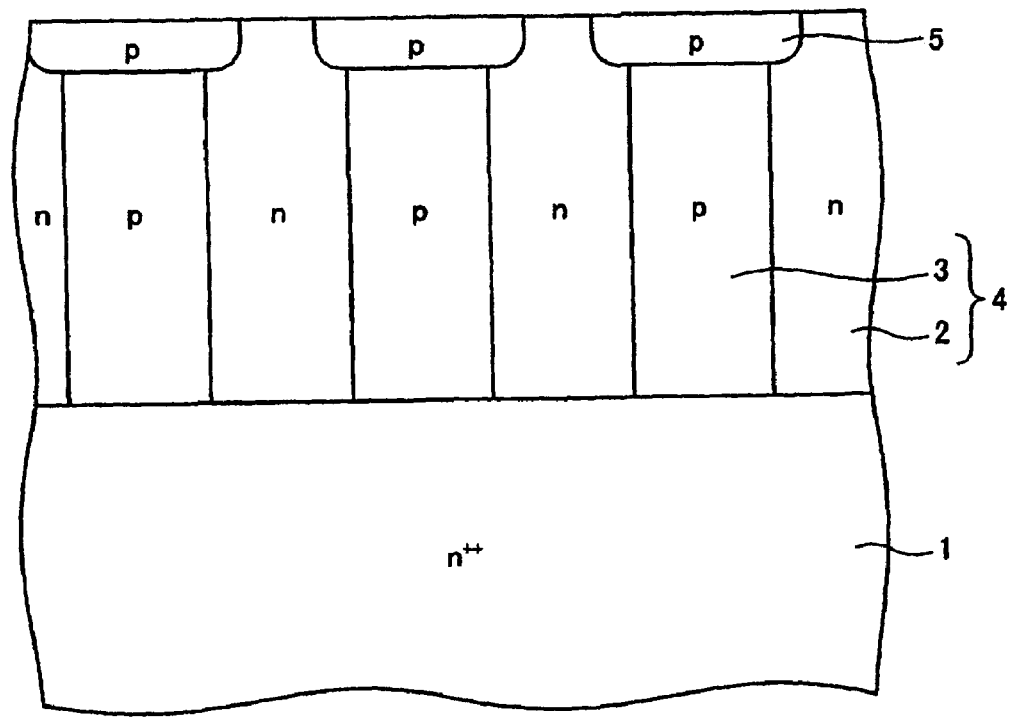
FIG. 10 is a sectional view showing important part of the semiconductor device having the super junction structure.

Then, as shown in FIG. 9, polishing is performed by a CMP (Chemical Mechanical Polishing) technique or the like to remove the silicon layer of the p-type semiconductor 27 protruding upward from the n-type semiconductor 22 by the epitaxial growth to thereby smoothen the surface of the semiconductor device. After smoothening, a cavity of the second trench 26 is formed in the surface of the n-type semiconductor 22. The cavity serves as an alignment marker 12. The parallel pn structure 4 and the alignment marker 12 are formed by the aforementioned process.

A field oxide film (not shown), a gate oxide film 7 and a gate electrode 8 are then formed successively by an ordinary MOSFET producing process as shown in FIG. 1. Then, the alignment marker 12 is used for forming a gate electrode pattern in the surface of the semiconductor substrate and a p base region 5 is formed by ion implantation and thermal diffusion based on self-alignment. An $n^+$ source region 6, an interlayer insulating film 10, a source electrode 9, a surface protection film not shown and a drain electrode 11 are further formed. Thus, a vertical MOSFET is completed.

An example of sizes and impurity concentrations of respective portions, process conditions, etc. will be described. Incidentally, the invention is not limited to these numerical values. When the withstand voltage is 600V, the n-type low resistance substrate 21 is, for example, 625 µm thick. The thickness and concentration of the n-type semiconductor 22 are, for example, 50 µm and $4\times10^{15}$ cm$^{-3}$ respectively. The surface of the n-type semiconductor 22 is heat-treated in an oxidizing atmosphere at 1150° C. for 20 hours by a thermal oxidation method such as pyrogenic oxidation to thereby form a mask oxide film 23. The mask oxide film 23 is, for example, 2.4 µm thick just after thermal oxidation. The opening of the first trench 25 is, for example, 6 µm wide. On the other hand, the opening of the second trench 26 is, for example, 10 µm wide. The first trench 25 is, for example, 50 µm deep. On the other hand, the second trench 26 is deeper than the first trench 25. In the etching process, the mask oxide film 23 is also etched in the etching step for formation of the first and second trenches 25 and 26. The remaining portions of the mask oxide film 23 are, for example, 1.1 µm thick.

Incidentally, it is preferable that the width of the second trench 26 is in a range of from 1.6 times to 2.5 times (both inclusively) as large as the width of the first trench 25. The reason why the second trench 26 is made wider than the first trench 25 is that a deeper trench can be formed as the trench becomes wider. The reason why the lower limit of the width of the second trench 26 is 1.6 times as large as the width of the first trench 25 is as follows. While the first trench 25 is filled with a p-type semiconductor 27 in a state where the mask oxide film 23 is removed fully, a p-type semiconductor 28 is grown on the inside of the second trench 26. However, an upper portion of the second trench 26 remains as it is not filled with the p-type semiconductor 28, so that a cavity is formed in the surface of the n-type semiconductor 22. The cavity can be made to serve as an alignment marker 12. On the other hand, the reason why the upper limit of the width of the second trench 26 is 2.5 times as large as the width of the first trench 25 is that a columnar protrusion called 'black silicon' can be prevented from being produced in the second trench 26. The black silicon is apt to be produced easily as the etching area in trench etching becomes larger.

As described above, in accordance with this embodiment, the alignment marker 12 can be formed concurrently with the formation of the parallel pn structure 4. For this reason, it is unnecessary to provide any additional step only for the formation of the alignment marker 12 in the ordinary MOSEFT producing process. Accordingly, improvement in efficiency of the producing process can be attained. Moreover, because the lower limit of the width of the second trench 26 is 1.6 times as large as the width of the first trench 25, the upper end portion of the second trench 26 not filled with the p-type semiconductor 28 remains as an alignment marker 12 even when the first trench 25 is filled with the p-type semiconductor 27 in the condition that the mask oxide film 23 is removed fully. Accordingly, the alignment marker 12 can be recognized accurately. For this reason, the mask oxide film 23 can be removed fully before the first trench 25 is filled with the p-type semiconductor 27. Accordingly, defects produced in the epitaxial layer by the influence of stress of the mask oxide film 23 can be reduced. Moreover, because the upper limit of the width of the second trench 26 is 2.5 times as large as the width of the first trench 25, black silicon can be prevented from being produced in the second trench 26 during etching. In addition, foreign matter such as pieces of the removed resist film or particles can be removed easily even when the foreign matter is deposited on the inside of the second trench 26 in a post step. Accordingly, a trench etching process without etching defects can be achieved, so that device characteristic can be prevented from deteriorating. Moreover, the surface structure of the device can be aligned accurately. In addition, it is unnecessary to clean the inside of the chamber of the trench etching apparatus frequently, so that the cost can be prevented from increasing.

The invention has been described with reference to certain preferred embodiments thereof. It will be understood, however, that modifications and variations are possible within the scope of the appended claims. For example, dimensions, concentrations, etc. described in the embodiment are only exemplary but the invention is not limited to those values. Although the embodiment has been described in the case where the first conductivity type is an n type while the second conductivity type is a p type, the invention can be achieved in the case where the first conductivity type is a p type while the second conductivity type is an n type. The invention can be applied not only to production of the MOSFET but also to production of another semiconductor device such as an IGBT, a bipolar transistor or a diode. In addition, the invention can be applied not only to the case where the parallel pn structure is produced but also to the case where trenches are formed in a semiconductor. Still further modifications and variations are possible other than those specifically recited above.

As described above, the semiconductor device producing method according to the invention is useful for a semiconductor device producing method including the step of forming trenches and is particularly preferably adapted to a method of producing a power semiconductor device having a super junction structure.

This application is based on, and claims priority to, Japanese Patent Application No: 2008-144915, filed on Jun. 2, 2008. The disclosure of the priority application, in its entirety, including the drawings, claims, and the specification thereof, is incorporated herein by reference.

What is claimed is:

1. A method of producing a semiconductor device comprising:
    forming a mask having a first opening and a second opening wider than the first opening on a principal surface of a first conductivity type semiconductor substrate;
    etching semiconductor portions of the first conductivity type semiconductor substrate exposed in the first and second openings to thereby form a first trench in the first opening and form a second trench deeper than the first trench in the second opening, wherein a width of the second trench is larger than a width of the first trench; and then
    filling the first and second trenches with a second conductivity type semiconductor to concurrently form an alignment marker for device production and a junction structure of alternate arrangement of the first conductivity type semiconductor and the second conductivity type semiconductor
    wherein the first and second trenches are filled directly by epitaxially growing the second conductivity type semiconductor so that an upper end portion of the second trench remains not filled with the second conductivity type semiconductor while the first trench is filled with the second conductivity type semiconductor.

2. The method of producing a semiconductor device as claimed in claim 1, wherein the upper end portion of the second trench that remains not filled comprises the alignment marker.

3. The method of producing a semiconductor device as claimed in claim 1, further comprising removing any mask remaining after the etching has been performed and before the filling of the first and second trenches.

4. The method of producing a semiconductor device as claimed in claim 1, wherein the width of the second trench is in a range of from 1.6 times to 2.5 times (both inclusively) as large as the width of the first trench.

5. The method of producing a semiconductor device according to claim 1, wherein a pattern of the first trench on a plane surface of the substrate is shaped like stripes while a pattern of the second trench on the plane surface of the substrate is shaped like a rectangle.

6. The method of producing a semiconductor device according to claim 1, wherein the material filled in the second trench forms a V shape in cross section.

* * * * *